United States Patent
Zou et al.

(10) Patent No.: US 10,923,683 B2
(45) Date of Patent: Feb. 16, 2021

(54) SUBSTRATE, METHOD FOR MANUFACTURING THE SAME, AND DISPLAY DEVICE

(71) Applicant: BOE Technology Group Co., Ltd., Beijing (CN)

(72) Inventors: Xiangxiang Zou, Beijing (CN); Wei Qin, Beijing (CN); Kuanjun Peng, Beijing (CN); Xiaolong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 50 days.

(21) Appl. No.: 16/035,524

(22) Filed: Jul. 13, 2018

(65) Prior Publication Data

US 2019/0074483 A1 Mar. 7, 2019

(30) Foreign Application Priority Data

Sep. 5, 2017 (CN) .......................... 2017 1 0794721

(51) Int. Cl.
*H01L 51/52* (2006.01)
*H01L 27/32* (2006.01)
*H01L 51/56* (2006.01)

(52) U.S. Cl.
CPC ........ *H01L 51/5268* (2013.01); *H01L 27/322* (2013.01); *H01L 51/56* (2013.01); *H01L 27/3211* (2013.01); *H01L 27/3244* (2013.01); *H01L 2251/5369* (2013.01)

(58) Field of Classification Search
CPC . H01L 51/5268; H01L 51/56; H01L 27/3211; H01L 2251/5369; H01L 27/3244
See application file for complete search history.

(56) References Cited

U.S. PATENT DOCUMENTS

| | | | | |
|---|---|---|---|---|
| 2007/0268587 | A1* | 11/2007 | Ninomiya | ................ G02B 1/14 359/601 |
| 2009/0015757 | A1* | 1/2009 | Potts | ...................... B82Y 30/00 349/69 |
| 2010/0019664 | A1* | 1/2010 | Mishima | ............. H01L 51/5268 313/504 |

* cited by examiner

*Primary Examiner* — Hrayr A Sayadian
(74) *Attorney, Agent, or Firm* — McDermott Will & Emery LLP

(57) ABSTRACT

The embodiments of the present disclosure propose a substrate, a method for manufacturing the same, and a display device comprising the substrate. The substrate comprises a supporting base; and a light scattering layer disposed such that a projected region of the light scattering layer on the supporting base is located in a light transmission formation region of the supporting base, and the light scattering layer has a light scattering structure configured to scatter incident light.

10 Claims, 3 Drawing Sheets

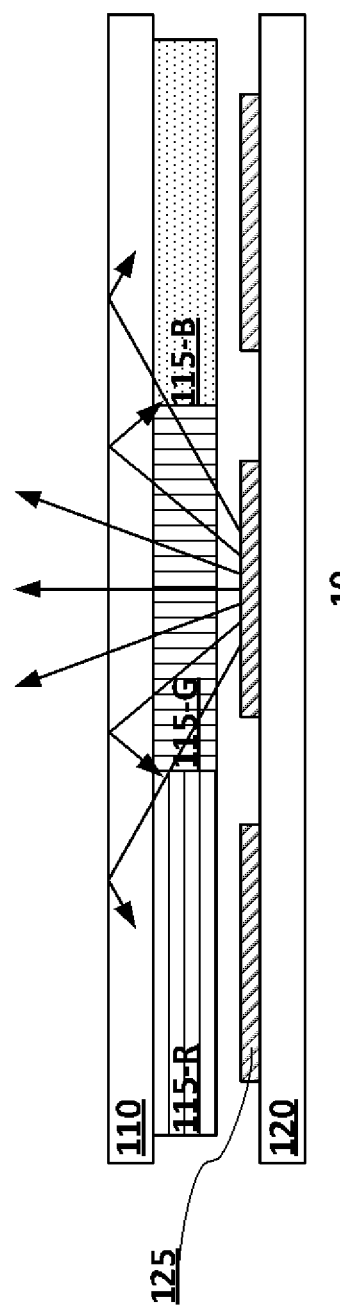
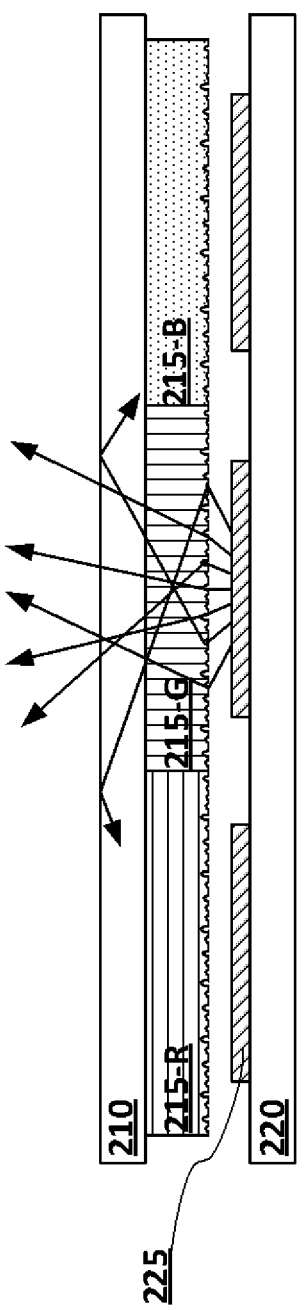

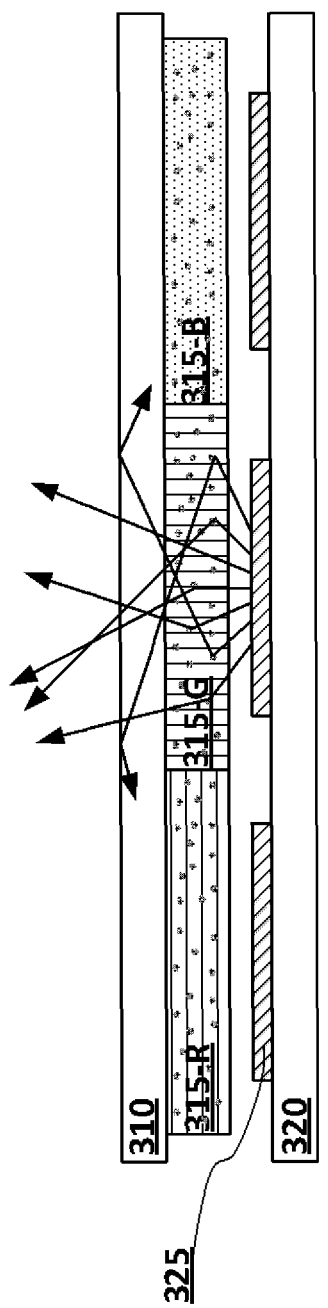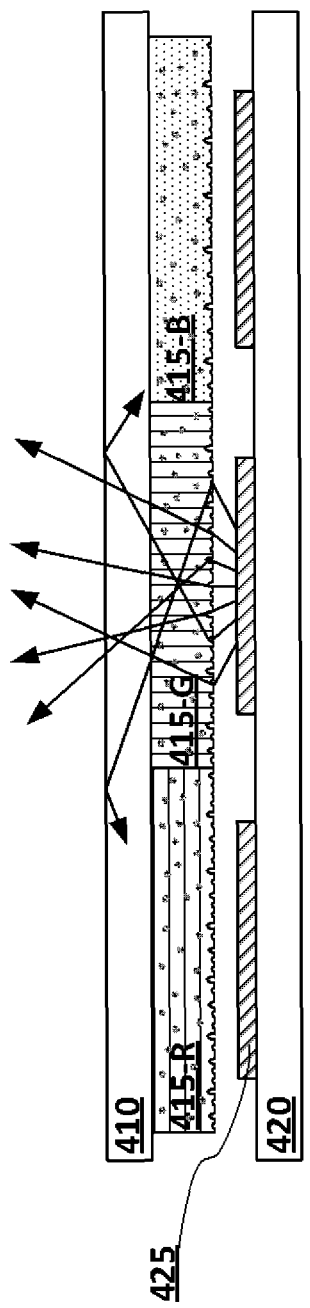

SUBSTRATE, METHOD FOR MANUFACTURING THE SAME, AND DISPLAY DEVICE

CROSS-REFERENCE TO RELATED APPLICATION(S)

This application claims priority to the Chinese Patent Application No. 201710794721.8, filed on Sep. 5, 2017, entitled "SUBSTRATE, METHOD FOR MANUFACTURING THE SAME, AND DISPLAY DEVICE", which is incorporated herein by reference in its entirety.

TECHNICAL FIELD

The present disclosure relates to the field of display technology, and in particular, to a substrate, a method for manufacturing the same, and a display device comprising the substrate.

BACKGROUND

Organic Light Emitting Diodes (OLEDs for short) are also called Organic Electroluminescent Display devices, which are display devices using an organic compound film between two electrodes which emits light in response to current. The OLEDs have advantages such as self-luminescence, wide view angle, high contrast, low power consumption, etc., and thus have gradually become a focus of attention in the field of display technology.

However, as a light of an OLED is generated in the device, light emitted by the OLED tends to be totally reflected in a process of emitting the light from the device. In turn, the light may be repeatedly reflected in the box and may eventually be converted into heat energy, which greatly affects the light utilization efficiency.

SUMMARY

In order to at least partially solve the above problems, there are provided a substrate, a method for manufacturing the same, and a display device comprising the substrate according to an embodiment of the present disclosure.

According to a first aspect, the embodiments of the present disclosure provide a substrate, comprising: a supporting base; and a light scattering layer disposed such that a projected region of the light scattering layer on the supporting base is located in a light transmission formation region of the supporting base, wherein the light scattering layer has a light scattering structure configured to scatter incident light.

Optionally, the light scattering structure comprises a diffuse reflection surface located on a surface of the light scattering layer away from the supporting base.

Optionally, the diffuse reflection surface comprises a concave-convex structure.

Optionally, the concave-convex structure is at least locally irregular.

Optionally, a peak-to-peak spacing of the concave-convex structure is about 0.5 micrometers, and a peak-to-valley height difference of the concave-convex structure is about 100 nanometers.

Optionally, the substrate is a color filter substrate, the supporting base is a transparent supporting base, and the light scattering layer comprises a color filter layer.

Optionally, a light scattering structure of the color filter layer comprises a diffuse reflection surface located on a surface of the color filter layer away from the transparent supporting base.

Optionally, the diffuse reflection surface comprises a concave-convex structure.

Optionally, the concave-convex structure is formed by ion beam bombardment or electron beam bombardment.

Optionally, the concave-convex structure is formed by cleaning soluble substance contained in the light scattering layer with a cleaning solution, wherein the cleaning solution can at least partially dissolve the surface of the light scattering layer away from the supporting base.

Optionally, the light scattering layer is doped with nanoparticles which scatter the incident light.

Optionally, the nanoparticles are polymethylmethacrylate (PMMA) particles.

Optionally, the substrate is a package substrate, and the light transmission formation region of the supporting base corresponds to a pixel light-emitting region of a surface of an array substrate which is assembled with the package substrate.

According to another aspect, the embodiments of the present disclosure provide a method for manufacturing a substrate, comprising: forming a light scattering layer on a supporting base, such that a projected region of the light scattering layer on the supporting base is located in a light transmission formation region of the supporting base; and forming a light scattering structure comprising a diffuse reflection surface by using ion beams or electron beams to bombard a surface of the light scattering layer away from the supporting base or by using a cleaning solution to clean soluble substance contained in the surface of the light scattering layer away from the supporting base.

According to yet another aspect, the embodiments of the present disclosure provide a display device comprising the substrate described above.

BRIEF DESCRIPTION OF THE DRAWINGS

The above and other purposes, features and advantages of the present disclosure will be more apparent from the following description of the preferred embodiments of the present disclosure with reference to the accompanying drawings, in which:

FIG. 1 is a cross-sectional view schematically illustrating an OLED display device according to the related art.

FIG. 2 is a cross-sectional view schematically illustrating an OLED display device according to an embodiment of the present disclosure.

FIG. 3 is a cross-sectional view schematically illustrating an OLED display device according to another embodiment of the present disclosure.

FIG. 4 is a cross-sectional view schematically illustrating an OLED display device according to yet another embodiment of the present disclosure.

DETAILED DESCRIPTION

Figure 5:
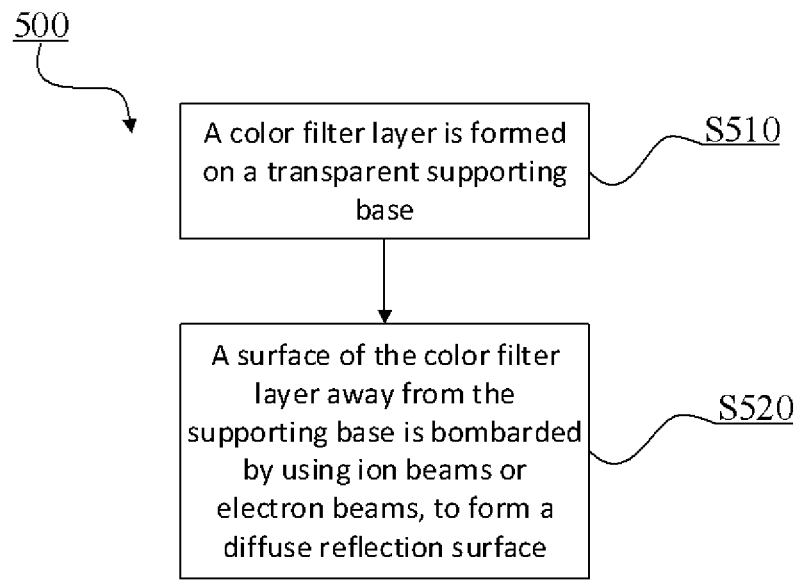
FIG. 5 is a flowchart illustrating an exemplary method for manufacturing a color filter substrate according to an embodiment of the present disclosure.

Some embodiments of the present disclosure will be described in detail below with reference to the accompanying drawings, and details and functions unnecessary for the present disclosure will be omitted in the description in order to prevent confusion of the understanding of the present disclosure. In the present specification, the following various embodiments for describing the principles of the present disclosure are illustrative only and should not be construed as limiting the scope of the present disclosure in any way. The following description with reference to the accompanying drawings is provided to assist in a comprehensive understanding of exemplary embodiments of the present disclosure as defined by the claims and their equivalents. The following description comprises various specific details to assist in that understanding but these details are to be regarded as being merely exemplary. Accordingly, those of ordinary skill in the art will recognize that various changes and modifications can be made to the embodiments described herein without departing from the scope and spirit of the present disclosure. In addition, descriptions of well-known functions and constructions are omitted for clarity and conciseness. Moreover, the same reference signs are used for the same or similar functions, devices, and/or operations throughout the accompanying drawings. Moreover, in the accompanying drawings, various parts are not necessarily drawn to scale. In other words, relative sizes, lengths, etc. of various parts in the accompanying drawings do not necessarily correspond to actual ratios.

In the present disclosure, the terms "include", "including" and derivatives thereof are intended to be inclusive and not limiting; the term "or" is inclusive, meaning and/or. In addition, in the following description of the present disclosure, orientation terms used, such as "up", "down", "left", "right", etc. are all used to indicate relative positional relationships to assist those skilled in the art in understanding the embodiments of the present disclosure. Therefore, it should be understood by those skilled in the art that "up"/"down" in one direction may become "down"/"up" in an opposite direction and may become another positional relationship in another direction, such as "left"/"right" etc.

Hereinafter, the present disclosure will be described in detail by taking the present disclosure being applied to an OLED device as an example. However, it should be understood by those skilled in the art that the field to which the present disclosure is applied is not limited thereto. In fact, the substrate, the method for manufacturing the same, etc. according to the embodiments of the present disclosure may be applied to other fields in which it needs to break a total reflection chain of light.

Next, some of the terms which will be used herein will firstly be generally described.

Total Reflection/Total Internal Reflection: This is a phenomenon which occurs when a propagation wave strikes a boundary of a propagation medium at an angle (angle relative to a normal of a reflection surface) greater than a certain critical angle. If a refractive index of the other side of the boundary is low and an incident angle is greater than the critical angle, the wave cannot pass through the boundary and is totally reflected. This is a particularly common phenomenon for light waves, but it also occurs for example in electromagnetic waves or sound waves.

Total Reflection Chain: In, for example, a propagation medium of which an upper surface and a lower surface are substantially parallel to each other, when, for example, light strikes the upper surface of the propagation medium from below at an incident angle greater than a critical angle (or strikes the lower surface of the propagation medium from above) in the propagation medium, the light is totally reflected to the lower surface (or the upper surface) due to the aforementioned total reflection phenomenon. At this time, as the upper surface and the lower surface are substantially parallel to each other, an incident angle on a next surface is substantially equal to an incident angle on a previous surface, and therefore total reflection is also formed on the next surface. By analogy, the light may continuously be totally reflected between the upper surface and the lower surface of the propagation medium and cannot escape from the propagation medium. For example, propagation of light in an optical fiber is realized using the principle of the total reflection chain.

Diffuse Reflection: Contrary to mirror reflection, the diffuse reflection means that when a beam of parallel light is incident on an interface between propagation media, emitted light from the interface is scattered toward various directions due to the irregularity of the interface.

Electron Beam Processing: It is a process involving the use of high energy $\beta$ rays to process objects. Typical electron beam processing devices may generally comprise an electron gun (including a cathode, a grid, and an anode) for generating and accelerating a main electron beam, and a magneto-optical (focusing and deflecting) system for controlling a manner in which the electron beam bombards a material to be processed (sometimes referred to simply as "workpiece" below). In operation, the cathode of the electron gun is a source of electrons which are thermally emitted. The electrons which are thermally emitted are accelerated and shaped by an electrostatic field formed by the grid and the anode into a collimated electron beam. The collimated electron beam is then emitted from the electron gun and strikes the workpiece through an electromagnetic lens and a deflection coil system (i.e., a magneto-optical system), and the deflection coil deflects the electron beam depending on whether the electromagnetic lens focuses or defocuses the electron beam, so as to form the desired processing effect on the workpiece.

Ion Beam Processing: It is similar to the electron beam processing except that it uses positively charged ions. However, unlike the electron beam processing, the ion beam processing is equivalent to ion implantation on a surface of a workpiece. Therefore, when ions are selected, it needs to select appropriate ions to avoid undesired effects on chemical, physical properties etc. of the workpiece.

Hereinafter, a total reflection chain phenomenon occurring in an OLED display device according to the related art will be described in detail with reference to FIG. 1.

FIG. 1 is a cross-sectional view schematically illustrating an OLED display device 10 according to the related art. In the OLED display device 10 shown in FIG. 1, a structure including a white light emitting layer and a color filter film is used. As shown in FIG. 1, the OLED display device 10 is formed by assembling a color filter substrate 110 with an array substrate 120. It should be illustrated that in the OLED display device 10 shown in FIG. 1, parts such as a black matrix, a Thin Film Transistor (TFT), etc. are not shown, various wirings etc. are not shown, and in addition, various specific film layers in sub-pixel units are not shown in detail either. However, it should be understood by those skilled in the art that this is for the sake of brevity of description, and not all the components of the OLED display device 10 are shown, but only portions related to the technical solutions according to the present application are schematically shown.

As shown in FIG. 1, one or more light emitting structures 125 are formed on the array substrate 120. The light emitting structures 125 each may comprise various film layers for emitting white light, which may comprise (but not limited to) an anode, a hole injection layer, a hole transport layer, an organic light emitting layer, an electron transport layer, an electron injection layer, a cathode, etc. Whether each light emitting structure 125 emits white light may be individually controlled using a TFT array formed on the array substrate 120. Although only an intermediate light emitting structure 125 is shown in FIG. 1 to emit light for convenience of explanation, the present disclosure is not limited thereto. In fact, any one of the one or more light emitting structures 125 may selectively emit light or not emit light under the control of the TFT array.

In addition, as also shown in FIG. 1, the color filter substrate 110 assembled with the array substrate 120 may comprise (but not limited to) a transparent supporting base and one or more color filter structures 115 formed thereon and corresponding to the one or more light emitting structures 125 of the array substrate 120 respectively. These color filter structures form a color filter layer as a whole. The one or more color filter structures 115 may comprise color filter structures for different colors, for example (but not limited to) a red color filter structure 115-R, a green color filter structure 115-G, and a blue color filter structure 115-B. Each of the color filter structures 115 forms a sub-pixel together with a corresponding light emitting structure 125 on the array substrate 120, and a group of Red (R)+Green (G)+Blue (B) sub-pixels form a single pixel unit. However, the present disclosure is not limited thereto, and other colors and layouts may also be used. For example, in some embodiments of the present disclosure, a layout of a red/green/blue (RGB)+White (W) color or a layout of a RGB+Green (G) color etc. may also be used.

It should be illustrated that although it is only shown in FIG. 1 that reflection of light occurs on an upper surface of the transparent supporting base, this is in fact merely for convenience of description. For example, in the embodiment shown in FIG. 1, the reflection may also occur at an interface between different layers, for example, between a lower surface of the color filter structure 115, an upper surface of the color filter structure 115, and a lower surface of the transparent supporting base, etc. In addition, although no refraction phenomenon is shown in FIG. 1 for convenience of description, in practice, different degrees of refraction should occur at the interface between various layers through which an optical path passes, except for a vertical incidence. However, considering that the reflection and refraction phenomenon not shown does not affect the understanding of the embodiments of the present disclosure by those skilled in the art, the description of the reflection and refraction phenomenon is omitted.

As shown in FIG. 1, light emitted by the intermediate light emitting structure 125 becomes green light after passing through the color filter structure 115-G and is emitted to the outside through the transparent supporting base, so that a user can see the green light emitted by the (sub)pixel. However, as described above and as shown in FIG. 1, a part of the green light (for example, two light rays on the left and two light rays on the right shown in FIG. 1) is totally reflected by an interface between the upper surface of the transparent supporting base and the outside due to an excessively large incident angle, and cannot be emitted to the outside of the OLED display device 10. As discussed above with respect to the "total reflection chain", this part of light is likely to continuously be totally reflected between the color filter substrate 110 and the array substrate 120 which are assembled, and be eventually converted into heat and consumed, which greatly reduces the light utilization efficiency.

In order to at least partially solve or alleviate this problem, there is proposed a technical solution according to an embodiment of the present disclosure. The embodiments of the present disclosure provide a substrate comprising a supporting base; and a light scattering layer disposed such that a projected region of the light scattering layer on the supporting base is located in a light transmission formation region of the supporting base, wherein the light scattering layer has a light scattering structure configured to scatter incident light.

In order to fully explain the operation mechanism of the embodiments of the present disclosure, a structure of a color filter substrate for improving the light utilization efficiency according to an embodiment of the present disclosure will be described in detail below by taking an OLED display panel as an example with reference to FIGS. 2 to 4.

FIG. 2 is a cross-sectional view schematically illustrating an OLED display device 20 according to an embodiment of the present disclosure. In the OLED display device 20 shown in FIG. 2, a structure including a white light emitting layer and a color filter layer (color filter film) is used. As shown in FIG. 2, the OLED display device 20 is formed after a color filter substrate 210 and an array substrate 220 are assembled. It should be illustrated that in the OLED display device 20 shown in FIG. 2, parts such as a black matrix, a TFT, etc. are not shown, various wirings etc. are not shown, and in addition, various specific film layers in sub-pixel units are not shown in detail either. However, it should be understood by those skilled in the art that this is for the sake of brevity of description, and not all the components of the OLED display device 20 are shown, but only portions related to the technical solutions according to the present application are schematically shown.

As shown in FIG. 2, one or more light emitting structures 225 are formed on the array substrate 220. The light emitting structures 225 each may comprise various film layers for emitting white light, which may comprise (but not limited to) an anode, a hole injection layer, a hole transport layer, an organic light emitting layer, an electron transport layer, an electron injection layer, a cathode, etc. Whether each light emitting structure 225 emits white light may be individually controlled using an TFT array formed on the array substrate 220. Although only an intermediate light emitting structure 225 is shown in FIG. 2 to emit light for convenience of explanation, the present disclosure is not limited thereto. In fact, any one of the one or more light emitting structures 225 may selectively emit light or not emit light under the control of the TFT array.

As shown in FIG. 2, the color filter substrate 210 assembled with the array substrate 220 (the color filter substrate 210 may serve as a package substrate for the array substrate 220) may comprise (but not limited to) a transparent supporting base and one or more color filter structures 215 formed thereon and corresponding to the one or more light emitting structures 225 of the array substrate 220, respectively. These color filter structures form a color filter layer as a whole. A projected region of the color filter layer on the transparent supporting base is located in a light transmission formation region of the supporting base (corresponding to a pixel light emitting region of the array substrate). The one or more color filter structures 215 may comprise color filter structures for different colors, for example (but not limited to) a red color filter structure 215-R, a green color filter structure 215-G, and a blue color filter structure 215-B. Each of the color filter structures 215 forms a sub-pixel together with a corresponding light emitting structure 225 on the array substrate 220, and a group of Red (R)+Green (G)+Blue (B) sub-pixels form a single pixel unit. However, the present disclosure is not limited thereto, and other colors and layouts may also be used. For example, in some embodiments of the present disclosure, a layout of a red/green/blue (RGB)+White (W) color or a layout of a RGB+Green (G) color etc. may also be used.

Unlike the OLED display device 10 shown in FIG. 1, in the embodiment shown in FIG. 2, each of the color filter structures 215 has a light scattering structure. In the embodiment shown in FIG. 2, the light scattering structure is a diffuse reflection surface formed on a lower surface of each of the color filter structures 215. The diffuse reflection surface comprises, for example, a concave-convex structure formed by using ion beams or electron beams to bombard a surface of the color filter structure away from the supporting base.

In some embodiments, a peak-to-peak spacing of the concave-convex structure is about 0.5 micrometers, and a peak-to-valley height difference of the concave-convex structure is about 100 nanometers. Here, the term "about" means that a deviation is within a certain range, for example, the deviation is not more than 20%, for example, the deviation is not more than 10%, or for example, the deviation is not more than 5%.

In some embodiments, the concave-convex structure is a concave-convex structure which is at least locally irregular. The "at least locally irregular" here means that in the concave-convex structure, there is at least one local region in which a peak-to-peak spacing or a peak-to-valley height difference between adjacent valleys or adjacent peaks which form the concave-convex structure is different from a peak-to-peak spacing or a peak-to-valley height difference of the concave-convex structure in another region.

The light scattering structure is formed on the lower surface of the color filter structure 215, so that an optical path of an incident light may be changed as shown in FIG. 2, which breaks the total reflection chain as shown in FIG. 1, and improves the light emission rate. For example, after the optical path of the incident light is changed through the diffuse reflection surface, an incident angle of a part of the light which may have been totally reflected on the upper surface of the transparent supporting base is changed, so that this part of the light may be directly emitted to the outside from the upper surface of the transparent supporting base. In addition, even if this part of the light is totally reflected as shown in FIG. 1 due to an improper angle, as the lower surface of the color filter structure 215 is now a diffuse reflection surface, when the light which is totally reflected reaches the diffuse reflection surface, a total reflection chain is not formed as in the scene shown in FIG. 1, but it is returned to the upper surface of the transparent substrate at different reflection angles, and may be emitted to the outside. Thus, the irregular diffuse reflection surface breaks the total reflection chain and improves the light emission rate.

FIG. 3 is a cross-sectional view schematically illustrating an OLED display device 30 according to another embodiment of the present disclosure. The structure shown in FIG. 3 is substantially similar to the structure shown in FIG. 2, except that unlike the diffusion reflection surface being formed on the lower surface of the color filter structure 215 as a light scattering structure in FIG. 2, in this embodiment, a light scattering structure is formed in a color filter structure 315. In the embodiment shown in FIG. 3, the light scattering structure is made of nanoparticles for scattering which are doped in the color filter structure 315. For example, the color filter structure is formed of a resin material, which has nanoparticles for scattering therein.

In some embodiments, the nanoparticles may be polymethylmethacrylate (PMMA) particles.

The light scattering structure is formed in the color filter structure 315, so that an optical path of an incident light may be changed as shown in FIG. 3, which also breaks the total reflection chain as shown in FIG. 1, and improves the light emission rate. For example, after the optical path of the incident light is changed through the color filter structure 315, an incident angle of a part of the light which may have been totally reflected on the upper surface of the transparent supporting base is changed, so that this part of the light may be directly emitted to the outside from the upper surface of the transparent supporting base. In addition, even if this part of the light is totally reflected as shown in FIG. 1 due to an improper angle, as the color filter structure 315 has nanoparticles therein, when the light which is totally reflected passes through the color filter structure 315, a total reflection chain is not formed as in the scene shown in FIG. 1, but it is returned to the upper surface of the transparent substrate at different reflection angles, and may be emitted to the outside. Thus, the structure with nanoparticles breaks the total reflection chain and improves the light emission rate.

FIG. 4 is a cross-sectional view schematically illustrating an OLED display device 40 according to yet another embodiment of the present disclosure. The structure of FIG. 4 is substantially similar to those of FIGS. 2 and 3, except that unlike FIG. 2 and FIG. 3, a color filter structure 415 in FIG. 4 comprises a light scattering structure including both the diffuse reflection surface and the nanoparticles described above. The light scattering structure is formed in the color filter structure 415, so that an optical path of an incident light may further be changed as shown in FIG. 4, which better breaks the total reflection chain as shown in FIG. 1, and further improves the light emission rate.

Next, an exemplary method 500 for manufacturing the color filter substrate 210 and/or 410 according to an embodiment of the present disclosure will be described in detail with reference to FIG. 5. FIG. 5 is a flowchart illustrating an exemplary method 500 for manufacturing the color filter substrate 210 and/or 410 according to an embodiment of the present disclosure. In the method 500, the color filter substrate 210 and/or 410 may be manufactured using steps described in detail below. Remaining steps are not involved in the present disclosure, and therefore the detailed illustration and description thereof will be omitted; but it should be understood by those skilled in the art that this does not affect the integrity of the present disclosure.

Specifically, the method 500 may begin with step S510 in which a color filter layer may be formed on a transparent supporting base. Next, in step S520, a surface of the color filter layer away from the supporting base may be bombarded using ion beams or electron beams, so that at least one surface of the formed color filter layer is a diffuse reflection surface. In addition, in step S510, nanoparticles, such as PMMA particles as described above, may be added in color filter adhesive for forming the color filter layer, so as to form the color filter layer (for example, the color filter layer 415), so that the formed color filter layer has nanoparticles for light scattering.

In addition, in some other embodiments, soluble substance may be added in the color filter layer, and may be cleaned in a deposition process, to realize a function of increasing roughness of the surface of the color filter layer, thereby achieving the light scattering structure as well. In some embodiments, the KOH solution currently used for etching may be used as a cleaning solution. In some embodiments, a mass concentration of the solution may be 1/100 to 1/120. The solution may be injected into an etching nozzle for spraying and etching during transportation of the color filter substrate. After a desired surface treatment is reached, deionized water may then be used for washing and drying on a production line to form the light scattering structure described above.

In addition, although the light scattering structure according to the embodiments of the present disclosure has been described above with reference to FIGS. 1 to 5 by taking a color filter substrate as an example, the present disclosure is not limited thereto. Although architecture including a white light OLED and a color filter is used in the above examples, the embodiments of the present disclosure are also applicable to structures such as red, green, blue (RGB) OLEDs.

In one embodiment, the light emitting structure on the array substrate may be OLED light emitting units which emit light of different colors, such as RGB, RGGB, etc. In this case, a similar light scattering structure may also be formed on a package substrate corresponding to the array substrate. For example, in some embodiments, the light scattering structure may be formed by forming the similar light scattering layer on a structural surface of the package substrate (i.e., a light transmission formation region of the package substrate) corresponding to a pixel light emitting region of the array substrate. The light scattering structure can also break a total reflection chain which may be formed after the two substrates are assembled, and improves the light emission rate. In some embodiments, the light scattering layer may comprise at least one of a cover glass surface, a surface of a planarization layer, and/or a surface of a transparent insulating filler layer, etc., and a process of forming the light scattering structure and a specific implementation of the light scattering structure may be known with reference to the above embodiment in which the light scattering structure is formed on the color filter layer.

Figure 6:
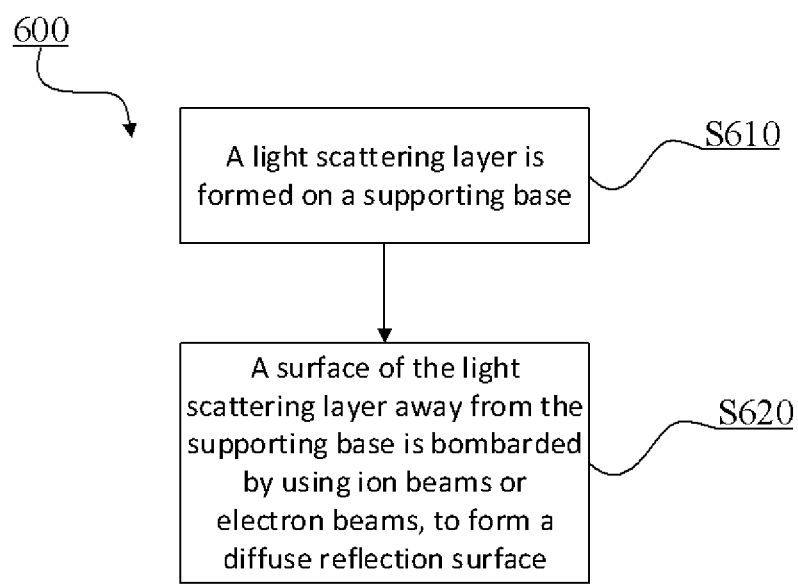
FIG. 6 is a flowchart illustrating an exemplary method for manufacturing a substrate according to an embodiment of the present disclosure.

Next, an exemplary method 600 for manufacturing the substrate according to an embodiment of the present disclosure will be described in detail with reference to FIG. 6. FIG. 6 is a flowchart illustrating an exemplary method 600 for manufacturing a substrate according to an embodiment of the present disclosure. In the method 600, the substrate may be manufactured using steps described in detail below. Remaining steps are not involved in the present disclosure, and therefore the detailed illustration and description thereof will be omitted; but it should be understood by those skilled in the art that this does not affect the integrity of the present disclosure.

Specifically, the method 600 may begin with step S610 in which a light scattering layer may be formed on a supporting base. Next, in step S620, a light scattering structure comprising a diffuse reflection surface may be formed by using ion beams or electron beams to bombard a surface of the light scattering layer away from the supporting base or by using a cleaning solution to clean soluble substance contained in the surface of the light scattering layer away from the supporting base. With the substrate, the method for manufacturing the same, and/or the OLED display device comprising the color filter substrate according to the embodiments of the present disclosure, the total reflection chain within the display device can be broken and the light emission ratio can be improved by changing the optical path of the emitted light, thereby reducing the power consumption and improving the light utilization efficiency. For example, in a case of simulation by using MATLAB, when a structure of an OLED in the related art is used, a light emission efficiency in the OLED is only 35%, and in a case that a light scattering layer is subjected to, for example, ion beam bombardment, electron beam bombardment, chemical cleaning or is doped with nanoparticles, or a surface or the interior of the light scattering layer is roughened, the light emission efficiency in the OLED can be increased to about 49%.

In one embodiment of the present disclosure, there is provided a display device comprising the substrate according to the embodiments described above. Although the embodiments described above are all schematically illustrated by taking an OLED display panel as an example, other similar display devices, such as LCD display panels which achieve color display through color filters, Quantum dot LED (QLED) display panels based on blue light excitation, electroluminescence-based QLED display panels etc. may be applied to the substrate disclosed in the embodiments of the present disclosure.

The present disclosure has heretofore been described in connection with the preferred embodiments. It should be understood that various other changes, substitutions, and additions may be made by those skilled in the art without departing from the spirit and scope of the present disclosure. Therefore, the scope of the present disclosure is not limited to the specific embodiments described above, but should be defined by the appended claims.

In addition, functions described herein as being implemented by pure hardware, pure software, and/or firmware may also be implemented by dedicated hardware, a combination of general hardware and software, etc. For example, functions described as being implemented by dedicated hardware (for example, Field Programmable Gate Array (FPGA), Application Specific Integrated Circuit (ASIC), etc.) may be implemented by a combination of general hardware (for example, Central Processing Unit (CPU), Digital Signal processor (DSP) etc.) and software, and vice versa.

We claim:

1. A color filter substrate, comprising:
   a transparent supporting base; and
   a light scattering layer disposed such that a projected region of the light scattering layer on the transparent supporting base is located in a light transmission formation region of the transparent supporting base, wherein the light scattering layer has a light scattering structure configured to scatter light emitted by pixels corresponding to the color filter substrate to break a total reflection chain of light,
   wherein the light scattering layer comprises a color filter layer,
   wherein the light scattering structure comprises a diffuse reflection surface located on a surface of the color filter layer away from the transparent supporting base, and
   wherein the diffuse reflection surface comprises a concave-convex structure.

2. The substrate according to claim 1, wherein the concave-convex structure is at least locally irregular.

3. The substrate according to claim 1, wherein a peak-to-peak spacing of the concave-convex structure is about 0.5 micrometers, and a peak-to-valley height difference of the concave-convex structure is about 100 nanometers.

4. The substrate according to claim 1, wherein the concave-convex structure is formed by ion beam bombardment or electron beam bombardment.

5. The substrate according to claim 1, wherein the concave-convex structure is formed by cleaning soluble substance contained in the light scattering layer with a cleaning solution, wherein the cleaning solution can at least partially dissolve the surface of the light scattering layer away from the supporting base.

6. The substrate according to claim 1, wherein the light scattering layer is doped with nanoparticles which scatter the incident light.

7. The substrate according to claim 6, wherein the nanoparticles are polymethylmethacrylate (PMMA) particles.

8. The substrate according to claim 1, wherein the substrate is a package substrate, and the light transmission formation region of the supporting base corresponds to a pixel light-emitting region of a surface of an array substrate which is assembled with the package substrate.

9. A method for manufacturing a color filter substrate, the method comprising:
   forming a light scattering layer on a transparent supporting base, such that a projected region of the light scattering layer on the transparent supporting base is located in a light transmission formation region of the transparent supporting base; and
   forming a light scattering structure comprising a diffuse reflection surface by using ion beams or electron beams to bombard a surface of the light scattering layer away from the transparent supporting base or by using a cleaning solution to clean soluble substance contained in the surface of the light scattering layer away from the transparent supporting base, such that light emitted by pixels corresponding to the color filter substrate to break a total reflection chain of light is scattered by the light scattering structure,
   wherein forming a light scattering layer comprises forming a color filter layer,
   wherein forming a light scattering structure comprises forming a diffuse reflection surface located on a surface of the color filter layer away from the transparent supporting base, and
   wherein forming the diffuse reflection surface comprises forming a concave-convex structure.

10. A display device comprising the substrate according to claim 1.

* * * * *